(12) United States Patent
Maroni et al.

(10) Patent No.: US 11,822,930 B2
(45) Date of Patent: Nov. 21, 2023

(54) ELECTRICALLY PROGRAMMABLE APPLICATION-SPECIFIC INTEGRATED CIRCUIT INITIALIZATION ENGINE

(71) Applicant: HEWLETT PACKARD ENTERPRISE DEVELOPMENT LP, Houston, TX (US)

(72) Inventors: Peter David Maroni, Windsor, CO (US); John E. Tillema, Fort Collins, CO (US); Erin Hallinan, Fort Collins, CO (US); Michael Joseph Howe, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 940 days.

(21) Appl. No.: 16/527,580

(22) Filed: Jul. 31, 2019

(65) Prior Publication Data

US 2021/0034375 A1 Feb. 4, 2021

(51) Int. Cl.
| | |
|---|---|
| *G06F 9/00* | (2006.01) |
| *G06F 9/4401* | (2018.01) |
| *H03K 19/1776* | (2020.01) |
| *G06F 9/24* | (2006.01) |
| *H03K 19/17772* | (2020.01) |

(52) U.S. Cl.
CPC .............. *G06F 9/4403* (2013.01); *G06F 9/24* (2013.01); *H03K 19/1776* (2013.01); *H03K 19/17772* (2013.01)

(58) Field of Classification Search
CPC ..... G06F 9/4403; G06F 9/24; H03K 19/1776; H03K 19/17772
See application file for complete search history.

(56) References Cited

U.S. PATENT DOCUMENTS

| | | | |
|---|---|---|---|
| 10,374,608 B1* | 8/2019 | Ross | H03K 19/17796 |
| 2005/0160217 A1* | 7/2005 | Gonzalez | G06F 11/1068 |
| | | | 714/E11.038 |
| 2008/0141017 A1* | 6/2008 | McCoull | G07F 17/32 |
| | | | 726/16 |
| 2008/0200206 A1* | 8/2008 | Mansson | G06F 9/4403 |
| | | | 455/556.1 |
| 2010/0287424 A1* | 11/2010 | Kwon | G06F 9/4401 |
| | | | 711/147 |

* cited by examiner

*Primary Examiner* — Xuxing Chen
(74) *Attorney, Agent, or Firm* — Sheppard Mullin Richter Hampton LLP

(57) ABSTRACT

A method of initializing an application-specific integrated circuit (ASIC), the method including reading, by a boot microcode engine integrated with the ASIC, microcode from an electrically programmable non-volatile memory (EP-NVM) integrated on a same die as the ASIC. The method further includes writing the microcode onto internal memories of a micro-controller of the ASIC and initializing the micro-controller by the boot microcode engine. The method also includes loading, by the micro-controller, a full boot image from an additional storage device distinct from the EP-NVM onto the internal memories of the micro-controller and initializing the ASIC by the micro-controller based on the full boot image.

20 Claims, 6 Drawing Sheets

US 11,822,930 B2

ELECTRICALLY PROGRAMMABLE APPLICATION-SPECIFIC INTEGRATED CIRCUIT INITIALIZATION ENGINE

BACKGROUND

An application-specific integrated circuit (ASIC) is used to optimize processing hardware for a specific application. The hardware may include preprogrammed memory, built-in communication protocols, specialized data and control interfaces, hardware-assisted data processing and algorithm implementation, and the like usable to control a specialized function, machine, or process. During the manufacturing of ASICs, they may also be preprogrammed to perform some of their functions.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
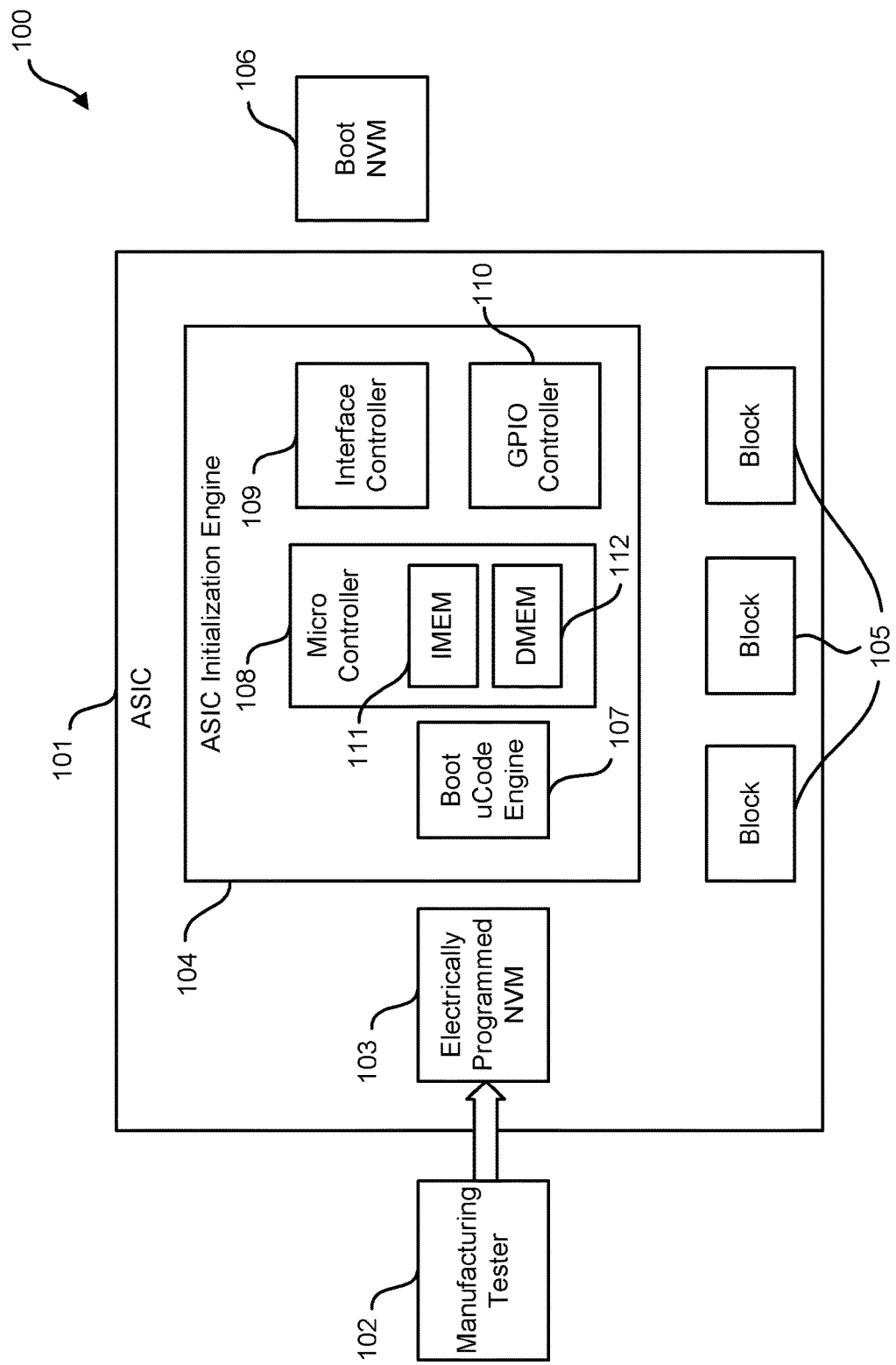
FIG. 1 is a configuration of an ASIC device with an initialization engine and a non-volatile memory (NVM) during a manufacturing process, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the terms "about" and "approximately" when applied to a value generally means within the tolerance range of the equipment used to produce the value, or in some examples, means plus or minus 10%, or plus or minus 5%, or plus or minus 1%, unless otherwise expressly specified.

Further, herein the term "substantially" as used herein means a majority, or almost all, or all, or an amount with a range of about 51% to about 100%, for example. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of the associated listed items. Moreover, examples herein are intended to be illustrative only and are presented for discussion purposes and not by way of limitation.

As briefly noted above, ASICs are used in many applications for cost reduction, performance, and customization. ASICs may implement many functions in hardware to allow faster processing of signals and data. ASICs can also run software to add flexibility.

ASICs are generally hardware-centric and most of their functionality is implemented in hardware to improve performance and processing speed, security, reliability and cost and time for development for some applications, such as embedded applications. In accordance with this disclosure, to enhance security and flexibility in manufacturing of ASICs, an on-die electrically programmable non-volatile memory (EP-NVM) may be created and electrically programmed during manufacturing to include a bootstrap image. This permits a more general hardware architecture to be employed to take advantage of the general benefits of ASICs, while also allowing the same basic ASIC hardware design to be used in multiple applications by using different software-driven configurations.

A die is a semiconductor piece or substrate cut from a larger semiconductor wafer, usually made of silicon (or other semiconductors) on which an integrated circuit (IC) has been created using the appropriate manufacturing processes, such as photolithography. The scope or extent of the IC on a die is predefined by the designer of the IC as one electronic product, such as a processor, which may actually contain many other smaller circuits or functional units, such as arithmetic logic unit (ALU), shift registers, and the like.

In an example implementation, an ASIC initialization engine is disclosed with an internal micro-controller, which may use an on-die EP-NVM, such as an eFuse bank, to control its behavior. During power-on boot, a hardware engine in the ASIC may read the initialization program from the on-die EP-NVM and write it to micro-controller memories for execution. Such programming provides the micro-controller with the functionality to perform various tasks under software control including reading boot images from external devices over a variety of interfaces and behaviors. The micro-controller may further authenticate the boot images and disable external write and read access to the micro-controller memories once authentication is completed. Depending on success of the previous operations, the micro-controller may boot and activate the full ASIC or indicate failure to boot via input/output pins.

Software engines, such as graphic engines, database engines, search engines, inference engines, video engines, and the like are computer programs that perform core functions in the field or domain they are designed for. Generally, software engines lack interactive interface like graphical user interface (GUI) and are often not passive software modules that are only activated when called by another software module, like an object method, function, a procedure, or a subroutine as they are commonly called in programming languages such as C# (C-Sharp), C, Pascal, and Fortran languages, respectively. In contrast, an engine is a software that once loaded into computer memory, runs in the background. When the engine is provided input data from other sources, such as other program modules, it uses its internal rules and metadata to process and transform the input data to another state or create other useful output.

For example, a search engine obtains target input data from a user interface such as a browser, and then applies its internal rules and metadata to find and return output data associated with the input data. The output data is displayed by the browser, which is a different software module than the search engine. An engine has a degree of autonomy regarding what it does with its input data and how it processes it independently of other program modules. A software engine obtains high-level data (less detailed) and performs high-level operations on them using many low-level (more detailed) operations to carry out its function. For example, a graphics engine may only be given a set of static pictures as input, and then the engine can calculate and render a moving image. For instance, several pictures of a car from different angles may be provided, and then the graphics engine may render how the car looks as it moves and turns and exposes different angles of view in a continuous and realistic manner. The engines disclosed herein perform their respective functions in a similar manner.

The example implementations disclosed herein allow complex and various initialization intelligence to be electrically programmed during manufacturing, which will allow a given ASIC type to be reused in a variety of topologies and applications. Lacking this ability creates the need for external hardware and firmware to manage ASIC initialization, which in turn, increases the cost and engineering effort for a solution to a particular application of ASIC. In addition, the disclosed initialization configuration is secure in that it allows the ASIC's initialization and authentication mechanism to be immutably set during the manufacturing flow. Such benefits are derived from the security provided by a hardware root of trust (RoT), while the hardware can be programmed for individual products without requiring a new ASIC.

RoT is created based on highly reliable hardware, firmware, and software components that perform specific, critical security functions. Because RoTs are inherently trusted, they should be secure by design. As such, many RoTs are implemented in hardware so that malware cannot tamper with the functions they provide. One of the elements of RoT is a secure and trusted memory that cannot be altered. The EP-NVM in the example implementations provides such secure memory. Other elements of RoT may exist, such as strong cryptography.

The use of a programmable, flexible micro-controller to drive various interfaces for data transmission to/from and initialization of various functional blocks on the ASIC, and the on-die EP-NVM to determine the power-on reset behavior of the micro-controller is highly desirable.

A functional block is a collection of circuit components and/or circuits that, together as a collaborative unit, perform a particular function. For example, a serial to parallel functional block may take serial binary data (bits) as input and convert them into a parallel packet of data such as an 8-bit byte or a 32-bit word.

In an example implementation, an ASIC may include an initialization engine the behavior and outputs of which are controlled by software running on an internal micro-controller deployed within the initialization engine. During the manufacturing of the ASIC, an EP-NVM may be created on the same die as the ASIC hardware for easy local access. The EP-NVM is not generally used as part of the ASIC's own design to perform its functions for its intended purpose, but rather a facility to accommodate the initialization of the ASIC. In some example implementations, once the ASIC Is initialized after power-up, this EP-NVM may no longer be used until next power-up. In other example implementations, a boot microcode engine (described later in more detail) may provide a control register interface, which allows the contents of EP-NVM to be queried. Whether or not the control register is used depends on a particular product, use-case, or application. For example, electrical parameters may be stored in the control register for a hot-pluggable link that would only be retrieved if or when that link gets enabled. During the manufacturing process of the ASIC, a manufacturing tester may burn a software image of microcode including a bootstrap module into the EP-NVM to be loaded into the initialization engine.

In an example implementation, a manufactured ASIC may pass through several stages in a power-on process. In a first stage the EP-NVM contents are retrieved by a microcode boot engine and deposited into instruction memory (IMEM) and data memory (DMEM) for execution by the microcontroller. The microcode and the bootstrap image retrieved from the EP-NVM generally provide the intelligence that allows the microcode boot engine to initialize and enable (boot up) the micro-controller to start functioning. This process may include enabling circuit clocks and power supplies within the ASIC.

In a second stage of the power-on process, a full boot image may be loaded onto the IMEM and DMEM because some of ASIC configurations may use additional software to fully initialize all its functional blocks. Such additional software may be in the form of a full boot image that is accessed and retrieved from a storage source external to the ASIC. This process may in turn include enabling off-chip (off ASIC die) clocks and power supplies to wake up and/or enable the external storage device.

In a third stage of the power-on process, once additional software or full boot image is obtained, the contents may be distributed throughout the ASIC functional blocks via various internal interfaces.

The above examples with on-die, EP-NVM allow hardware-based RoT, as noted earlier. Also, the use of the non-erasable or once-only programmable on-die EP-NVM ensures security as well as flexibility. Once programmed the EP-NVM contents are secured from tampering or change and the same basic ASIC configuration may be used in a wide range of systems or devices that may have opposing requirements accommodated by using different boot images and microcode.

To address the security and flexibility concerns described above, in an implementation, an ASIC is disclosed including a die on which the ASIC is fabricated, an EP-NVM integrated on the die, the EP-NVM being distinct from the ASIC and including a set of executable instructions, an ASIC initialization engine including a boot microcode engine and a micro-controller, the boot microcode engine to program the micro-controller with the executable instructions upon initialization, and a plurality of functional blocks to perform predefined functions for the ASIC.

Also disclosed is method of initializing an ASIC, the method including reading, by a boot microcode engine deployed within an ASIC initialization engine integrated with the ASIC, microcode electrically programmed onto an EP-NVM. The method further includes writing the microcode onto internal memories of a micro-controller of the ASIC, initializing the micro-controller by the boot microcode engine, and initializing the ASIC by the micro-controller based on the microcode.

Further disclosed is a method of initializing an ASIC, the method including reading, by a boot microcode engine integrated with the ASIC, microcode from an EP-NVM integrated on a same die as the ASIC, and writing the microcode onto internal memories of a micro-controller of the ASIC. The method further includes initializing the micro-controller by the boot microcode engine, loading, by the micro-controller, a full boot image from an additional storage device distinct from the EP-NVM onto the internal memories of the micro-controller, and initializing the ASIC by the micro-controller based on the full boot image.

FIG. 1 is a configuration 100 of an ASIC device 101 with an initialization engine 104 and an EP-NVM 103 during a manufacturing process, according to one or more examples of the disclosure. In an example implementation, the ASIC device 101 may be coupled with a manufacturing tester 102. The ASIC device 101 may include the electrically programmable EP-NVM 103, an ASIC initialization engine 104. The ASIC initialization engine 104, in turn, includes a boot microcode engine 107, a micro-controller 108 having IMEM 111 and DMEM 112, an interface controller 109, a general-purpose input output (GPIO) controller 110, and other various functional blocks 105. An external, off-chip or off-die, boot NVM 106 may be accessible by the ASIC device 101.

The manufacturing tester 102 may include an integrated on-die NVM programmer that is configured to handle the write voltage and timing used to write binary data and instructions to the EP-NVM 103. Once the writing of the digital information, such as bootstrap image and microcode, is complete the contents of the EP-NVM 103 cannot be overwritten or changed providing security for the ASIC configuration being manufactured. Since the EP-NVM 103 is created on the same die as the ASIC device 101 and cannot be overwritten after programming, the ASIC device 101 is secure when it leaves manufacturing for use in its intended devices and/or applications.

In some example implementations, the ASIC initialization engine 104 is created as a functional block of the ASIC device 101 to boot up the ASIC device 101 and initialize its functional blocks 105 by loading various data into designated registers and/or turn on electronic switches to enable them to function and/or control their behavior. The initialization is generally done during the power-on process after manufacturing. As noted above, the ASIC initialization engine 104 includes a number of functional blocks described further below.

The boot microcode engine 107 reads the microcode and bootstrap image from the on-die EP-NVM 103 and writes to IMEM 111 and DMEM 112, as appropriate. Namely, the instructions are copied to the IMEM 111 to be executed by the micro-controller 108, while data such as configuration information, time values, port numbers, protocol identifiers, link or source address information, and other data are written to the DMEM 112.

A bootstrap image is computer code that generally resides in a non-volatile, read only memory (ROM) and is executed automatically upon computer (or any programmable computing device) powerup. The bootstrap image includes the information used to load higher level and more extensive software, such as the operating system of the computer. In some systems and configurations, before loading the main operating system, the bootstrap image may also load or cause to be loaded a full boot image, which provides a richer and more extensive program to load larger and more extensive operating systems and initializations.

The boot microcode engine 107 may be implemented as a finite state machine (FSM), a direct memory access (DMA) chip, or other hardware that can move or copy memory contents from the EP-NVM 103 to the IMEM 111 and DMEM 112. The transfer of memory contents may be done serially or in parallel using bytes or words. The data transfer protocol depends on the type of interface, power and performance requirements, and corresponding costs. For example, using a serial protocol, bytes from a source memory location are serialized into a stream of bits and then assembled back, or deserialized, at the destination memory. For ASICs, a finite state machine may have the advantage of simplicity and low cost. A state machine includes a number of predefined states, defined based on the various conditions or values of multiple outputs of the state machine, a particular combination of which defines a particular state. The state machine may transition from one state to another based on the present state and the combination of one or more inputs to the state machine. The states and transition conditions are generally shown as a table with states (for example, shown as rows) and inputs (as columns) that define the state machine's behavior.

The EP-NVM 103 may be created on the same die as the ASIC, but it is distinct from the ASIC as a functional unit. Being distinct in this context means that the EP-NVM 103 is not part of the design of the ASIC itself and plays no role in the functions that the ASIC performs in its intended application, but an external facility to enable the ASIC be initialized before performing its intended functions. In this configuration, once the ASIC is initialized upon power-up by the boot microcode engine 107 and later by the micro-controller 108, the EP-NVM 103 no longer plays a role in the operation of the ASIC. It is a pre pre-power up facility used for the initialization of the ASIC.

The IMEM 111 and DMEM 112 are generally random access memory (RAM) on which the micro-controller can operate. Specifically, the micro-controller may fetch instructions from the IMEM 111, execute the instructions, and store any intermediate or final computation results in the DMEM 112.

The micro-controller 108 is generally a programmable processor for initializing the ASIC device 101. The initialization function is generally done mostly at power-on of the ASIC. It may entail some re-configuration after power-on during the operation of the ASIC if desired. For example, based on input received by the ASIC from its environment, or based on a predetermined or predefined time period, the micro-controller may be employed to download further instructions and/or data from an external source to reconfigure or refresh the ASIC's parameters.

The initialization may be internal and/or external. The internal initialization may include enabling various devices such as synchronization computer bus clocks, power supplies, and/or enabling various modes of operation of some of the functional blocks 105, depending on the application. For example, one functional block 105 may be used for performing a certain type of calculation (for example, digital image filtering based on a particular algorithm) depending on whether a particular bit is set in a particular configuration register. If the particular bit is set (e.g., to logic "1") the block may perform the calculation and if the bit is not set, the block may not perform the calculation or may perform a different type of calculation.

The internal initialization may include first fetching a software image, for example, more microcode including a full boot image, from another internal device distinct from the EP-NVM 103, or an external device such as boot NVM 106. For external devices, external initialization may be performed by the ASIC initialization engine 104, such as enabling an external clock or power source.

The interface controller 109 may control various interfaces between the ASIC initialization engine 104 and other devices such as the external device, boot NVM 106, and or internal devices such as IMEM 111 and DMEM 112 or some of the functional blocks 105. The interface controller may also control a network interface (for example, a network interface controller, or NIC) based on a particular network protocol and layer by translating network packets and frames for transmission or upon receipt. Other types of controllers depend on other protocols that they implement, such as serial, parallel, universal serial bus (USB), and the like.

The GPIO controller 110 is a general-purpose data channel coupling a circuit to other circuits, devices, or systems. It generally includes one or more hardware pins for digital data transmission, the semantics of which are determined by the circuit designer based on the application of the circuit. The GPIO controller 110 controls how the GPIO channel is used or behaves under software program control. In some applications, the GPIO interface may be used to signal to a host computer or a human operator the status of the ASIC device 101, for example, by turning on a light emitting diode (LED) to signify success or failure of some operation. In some applications or configurations, the GPIO interface may be used to enable or disable other devices or functional blocks by sending an appropriate signal to appropriate inputs of the receiving device.

The functional blocks 105 may include any circuits or devices that perform specific functions for the ASIC device 101. The functional blocks 105 are part of the architecture of the ASIC device 101 and are generally created to perform the predefined functions for which the ASIC is designed. Each functional block 105 may include an interface coupling it to other functional blocks, controllers, memory, or other devices. Some of the functional blocks may be programmable or configurable entities that are initialized at power-on by the micro-controller 108, and some of the functional blocks may only be enabled (for example, turned "ON"). Initialization of programmable or configurable devices may include loading an appropriate microcode segment, setting particular register bits, and the like. Still other parts of the initialization may include establishing data paths between the functional blocks 105. Depending on the function, a functional block may be implemented as an FSM.

In some example implementations, the functional blocks 105 may be different parts of the same process. For example, in an image processing ASIC that may be used in a camera or a security system, one or more functional blocks 105 may be used as digital filters to enhance an image, while other functional blocks may detect particular features, such as a human face or human eyes after the filtering process is completed.

In some example implementations, the functional blocks 105 may work in parallel, while in other implementations and depending on the application, they may work in series. And still in other implementations or applications some of the blocks may work together in parallel while others work in series. In the image processing example above, the image data may be acquired by the ASIC device 101 and passed through the appropriate functional blocks 105 sequentially to process the image.

The boot NVM 106 or other storage devices such as disc, network storage, and the like, may be used to retrieve a full boot image if one is used by a particular ASIC type that uses more extensive software to function. The boot NVM 106 (or other storage device) interface may be controlled by the interface controller 109 to effect data transfer to ASIC memory.

Figure 2:
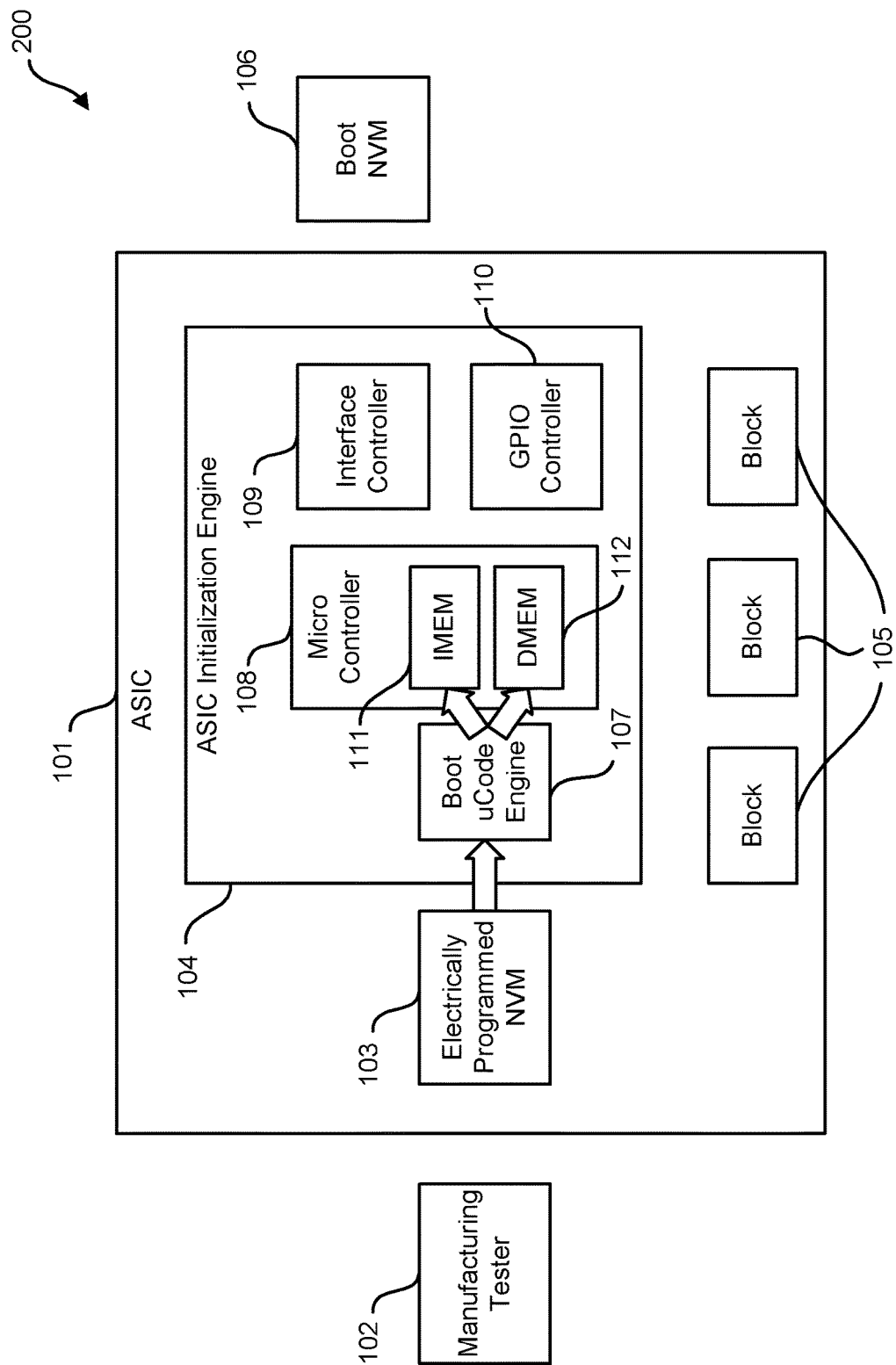
FIG. 2 is the ASIC device of FIG. 1 during a first stage of a power-on process, according to one or more examples of the disclosure.

FIG. 2 is the ASIC device 101 of FIG. 1 during a first stage 200 of a power-on process, according to one or more examples of the disclosure. In an example implementation, at the first stage 200 of power-on, the boot microcode engine 107 accesses the EP-NVM 103 via a data interface to read or copy instructions and data included in the microcode or bootstrap image and load this information into IMEM 111 and DMEM 112 as appropriate. As noted above with respect to FIG. 1, the microcode and bootstrap image are permanently written onto the EP-NVM 103 by the manufacturing tester 102. Once written into a particular ASIC at manufacturing time, the microcode including the bootstrap image cannot be changed. The microcode written onto the EP-NVM 103 associated with one type of ASIC may be different from the microcode written for another type of ASIC. For example, for image processing applications, the ASIC used for one type or class of camera may be different than a similar ASIC for another type of camera. Such difference is reflected in and determined by the microcode written to the EP-NVM 103 by the manufacturing tester 102.

The boot microcode engine 107 may perform several functions including transfer of microcode and bootstrap image from the EP-NVM 103 to the micro-controller IMEM 111 and DMEM 112, enabling clocks and power supplies that support the operation of the micro-controller 108, and enabling the micro-controller 108 itself to start executing the bootstrap image from the IMEM 111 and DMEM 112.

For the micro-controller 108 to function, other hardware facilities and components may have to be started first. As indicated above, this may include enabling a clock signal and a power supply to provide the basic electrical and computing facilities used by the micro-controller 108 to start executing instructions from IMEM 111. The enabling of such components is conditioned upon the microcode providing the needed information, such as any register address, timing information, and the like. Once these components are enabled, the micro-controller 108 may be enabled to start executing instructions.

Once the micro-controller 108 starts executing instructions from IMEM 111, it will initialize other functional blocks and components on the ASIC device 101. The initialization process for a particular component depends on the component, however, it may generally entail providing power, enabling hardware, transferring instructions and/or data, setting certain bits in a register, enabling input and/or output buffers to allow transfer of data or signals, indicating to the component a mode of operation or protocol that is to be used, and generally performing other actions to allow a component to start performing the functions it is designed for a particular application. In the ASIC device 101, one or more of the functional blocks 105 may use some initialization as described above. Such initialization may be performed by the micro-controller 108 provided that the initialization information is provided by the microcode or bootstrap image transferred by the boot microcode engine 107.

Figure 3:
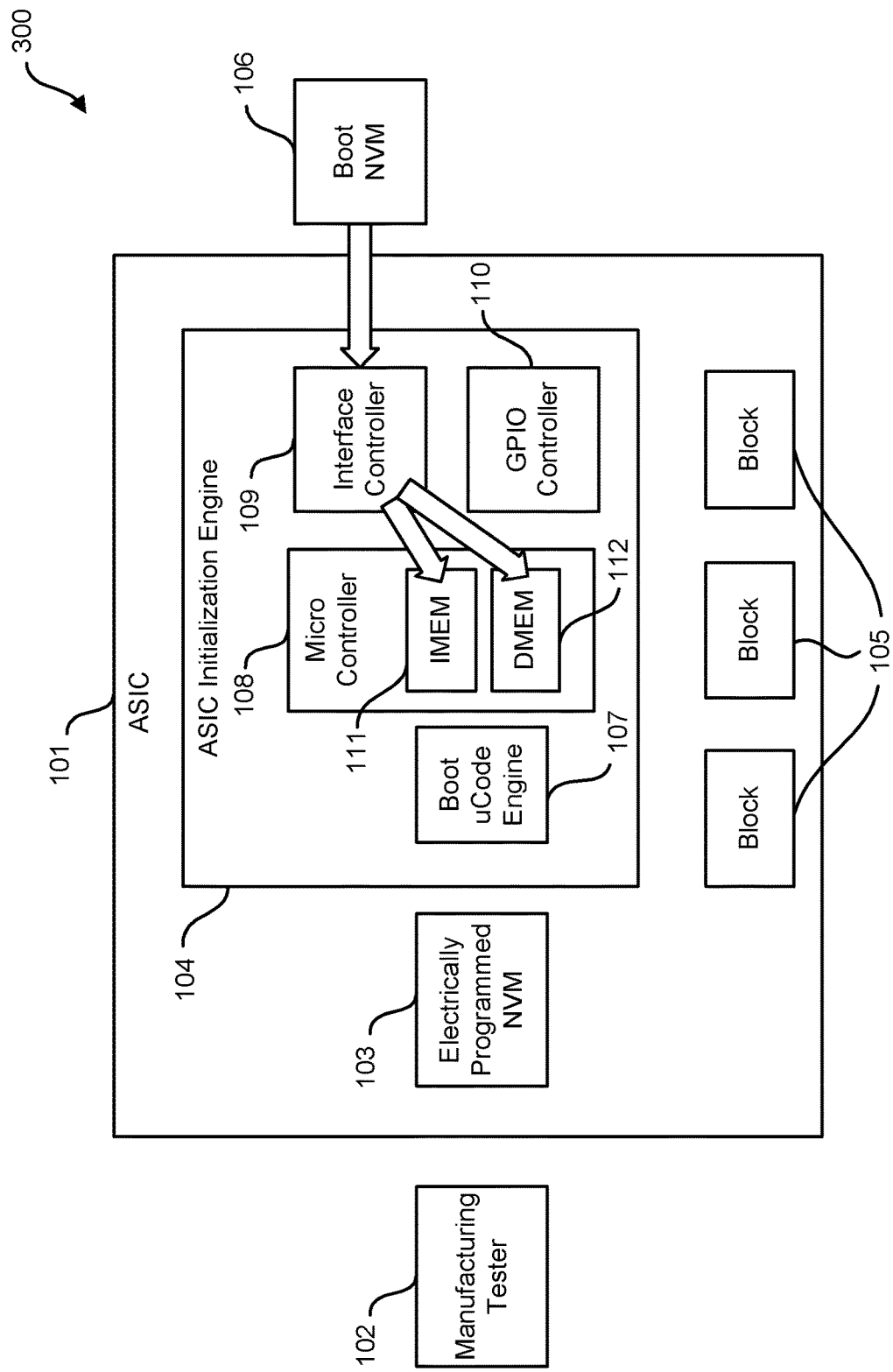
FIG. 3 is the ASIC device of FIG. 1 during a second stage of the power-on process, according to one or more examples of the disclosure.

FIG. 3 is the ASIC device 101 of FIG. 1 during a second stage 300 of the power-on process, according to one or more examples of the disclosure. In some versions or applications of the ASIC device 101, the information provided from the EP-NVM 103 via the microcode or bootstrap image may not be sufficient for the complete initialization of the ASIC device 101. In such cases, the micro-controller 108 may obtain more information from alternate sources. The microcode or bootstrap image already loaded into the IMEM 111 and DMEM 112 may provide the information necessary to allow the micro-controller 108 to retrieve further information used for the complete initialization of the ASIC device 101. For example, the loaded microcode may provide an identification, location, or other indication of an additional external storage device or another on-die storage or memory device, in addition to the EP-NVM 103, from which the additional information may be retrieved. The additional information may be embedded in a full boot image contained in the additional storage device.

Based on the access information from the microcode for retrieving the additional information, the micro-controller 108 may have to enable or initialize the additional external or on-die storage device before the additional information can be retrieved. For example, the micro-controller 108 may enable an external clock and/or power supply, based on the information already provided by the microcode from the EP-NVM 103, to enable the additional storage device to provide the additional information. In some example implementations, the additional storage device may be an on-die read only memory (ROM), an external disk, the external boot NVM 106, or any other storage device.

A security check may be performed to validate and/or authenticate the additional information, such as the full boot image, retrieved from the additional storage device. Other verifications may also be performed by the microcode run on the micro-controller 108, such as integrity check. Validation and Integrity check of data and/or software may be performed in various ways, such as using checksums or other verification methods. This is to ensure the software is able to perform the tasks it was designed for and that it is not corrupted (having invalid bits or segments.) Authentication is a process or method by which it is ensured that the software is from a source that is intended, for example a trusted source. Once the full boot image is verified for authenticity and/or integrity, the micro-controller 108 may start executing the additional information in the form of a full boot image or other software modules.

The additional software and/or data may eventually be stored in IMEM 111 and DMEM 112. This transfer of information to the memory may occur before, during, or after the validation and authentication processes. In one example implementation, the micro-controller 108 may retrieve the full boot image from the boot NVM 106 (or generally, additional software and data from additional storage sources) and store it in the IMEM 111 and DMEM 112 before starting the validation and authentication process while the new software is in the memory. In another example implementation, the micro-controller 108 may retrieve the full boot image from the boot NVM 106 one segment at a time, validate and authenticate each segment, store in IMEM 111 and/or DMEM 112, and move on to the next segment. This way the data transfer is performed during the validation and authentication processes. In still another example implementation, the micro-controller 108 may retrieve some data or code segments for other functional blocks of the ASIC device 101, from the boot NVM 106 one segment at a time, validate and authenticate each segment, and then transfer them to the intended functional block as further described below.

Figure 4:
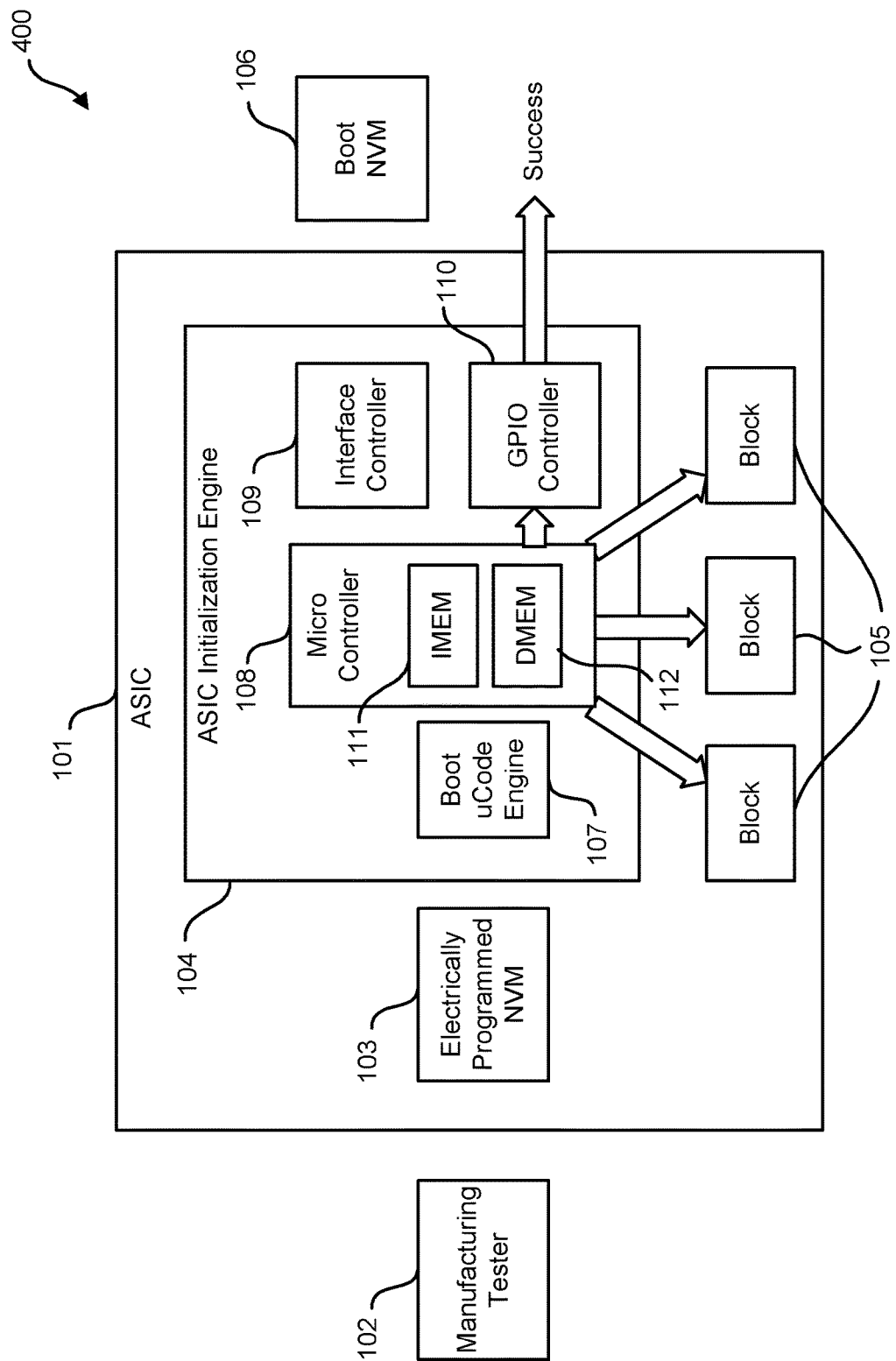
FIG. 4 is the ASIC device of FIG. 1 during a third stage of the power-on process, according to one or more examples of the disclosure.

FIG. 4 is the ASIC device of FIG. 1 during a third stage 400 of the power-on process, according to one or more examples of the disclosure. At this stage, the micro-controller 108 has already retrieved the additional software (e.g, full boot image) from an additional on-die storage or external storage (e.g., boot NVM 106). The additional software, program modules, and/or data so obtained may include program segments and/or initialization data for other functional modules on the ASIC device 101. The Micro-controller 108 may use the interface controller 109 to initialize various functional blocks 105 of the ASIC device 101 with the recently transferred software and data.

In some example implementations, the functional blocks 105 may use software programs and/or data to perform their respective functions, which will depend on the application of the ASIC device 101. For example, in an image processing application, such as a camera or a smartphone (with a camera), one functional block 105 may be responsible for filtering a newly acquired image according to certain criteria. Such filtering and criteria may in turn use initialization data for mathematical calculations, command registers (within the functional block) set to select one of several modes of operation, and the like. Each functional block 105 may also have a different interface for communications and data transfer. The interface controller 109 may be used to transfer the program segment and data from the micro-controller 108 to the functional blocks 105 via their respective interfaces. The interface controller 109 uses knowledge of such interfaces, such as timing, protocols, control signals, and the like, to facilitate data transfer.

The full boot image or the additional software and data, such as device drivers, communications protocol parameters, database interfaces, or other information may also be stored in the IMEM 111 and DMEM 112 for the general use and operation of the ASIC device 101 and/or the ASIC initialization engine 104. This information may be in addition to the information used for initialization of the functional blocks 105 of the ASIC device 101.

The success or failure of the overall bootup of the ASIC device 101 may be indicated via the GPIO controller to the outside computing environment, including human operators. The indication may be, for instance, turning on a red or green light to mean success or failure, respectively, or it may be more comprehensive by transmitting a series of data bytes to identify exactly which functional blocks 105 or other parts of the ASIC were successfully initialized or failed to do so.

Figure 5:
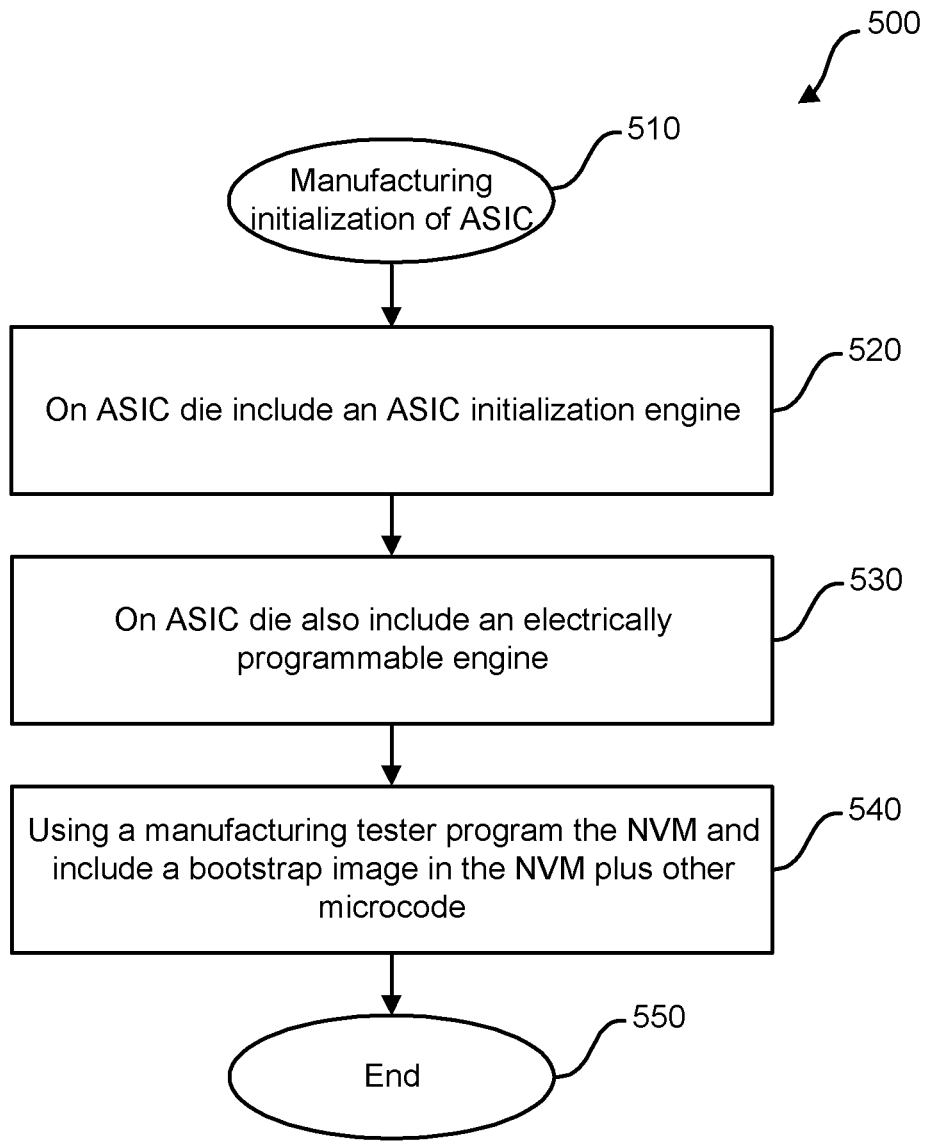
FIG. 5 is a flowchart depicting a method for initialization of an ASIC during a manufacturing process, according to one or more examples of the disclosure.

FIG. 5 is a flowchart depicting a method 500 for initialization of an ASIC during a manufacturing process, according to one or more examples of the disclosure. The manufacturing initialization method 500 starts at block 510 during a manufacturing process of the ASIC and moves forward to Block 520.

At block 520 of the manufacturing process an ASIC initialization engine module 104 is created on the same substrate or die that the entire ASIC device 101 is created. The purpose and function of this initialization engine is to obtain the software, microcode, data, and other information from various sources used to initialize the ASIC and its various modules and functional blocks 105, as described herein. manufacturing initialization method 500 proceeds to block 530.

At block 530 of the manufacturing process an EP-NVM module 103 is created on the same substrate or die that the entire ASIC device 101 is created. The purpose and function of the NVM is to store an initial microcode, including a bootstrap image, provided by the manufacturing tester 102 during the manufacturing process. The software, microcode, data, and other information from various sources used to initialize the ASIC and its various modules and functional blocks 105, as described herein, are electrically and irreversibly programmed into the EP-NVM 103. Once programmed, the contents of the EP-NVM 103 cannot be altered, erased or changed. The manufacturing initialization method 500 proceeds to block 540.

At block 540 of the manufacturing process, the manufacturing tester 102 electrically writes the initial microcode including a bootstrap image onto the electrically programmable EP-NVM 103. Once the contents are written or burnt into the EP-NVM 103, the contents cannot be altered, erased or changed in any way. This process provides a hardware-based security system that does not allow tampering with the contents of the EP-NVM 103. This process creates a hardware RoT based on which other actions are carried out securely during a later power-on process will depend. Such actions during the power-on process include obtaining additional software and a full boot image from other storage sources and initializing other modules on the ASIC, as described herein. The manufacturing initialization method 500 proceeds to block 550.

At block 550 of the manufacturing process, the manufacturing initialization method 500 terminates.

Figure 6:
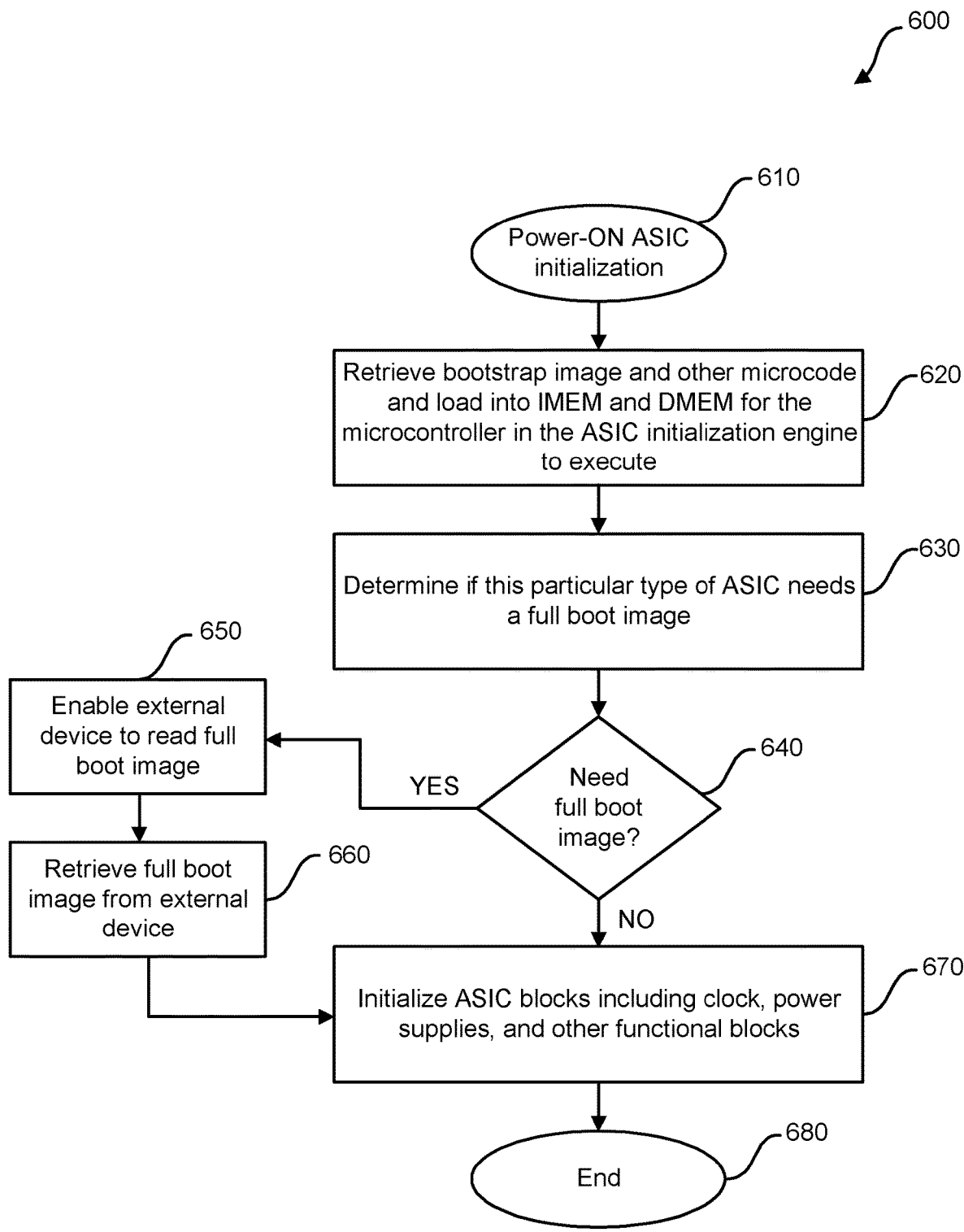
FIG. 6 is a flowchart depicting a method for initialization of an ASIC during a power-on process, according to one or more examples of the disclosure.

FIG. 6 is a flowchart depicting a method 600 for initialization of an ASIC during a power-on process, according to one or more examples of the disclosure. The power-on initialization method 600 starts at block 610 and proceeds to block 620.

At block 620 of the power-on process, the boot microcode engine 107 copies the contents of the electrically programmable EP-NVM 103 onto IMEM 111 and DMEM 112 and initializes the micro-controller 108 and powers it up. The contents of the EP-NVM 103 may be the microcode and the bootstrap image plus some data. The initialization may include enabling a clock and a power supply to enable the ASIC initialization engine 104 and micro-controller 108 to start functioning. Once powered up, the micro-controller 108 starts fetching instructions from the IMEM 111 and executing them. The bootstrap image being executed by the micro-controller 108 at this point enables the micro-controller 108 to initialize other circuits and modules on the ASIC device 101 to bootup and enable the whole ASIC device 101 to become functional for its intended application. The power-on initialization method 600 proceeds to block 630.

At block 630 of the power-on process, the micro-controller 108, running the bootstrap image and/or other microcode and based on the intelligence provided by these software, determines whether the present type of ASIC, of which the micro-controller is a part, uses additional software or data. Some ASIC types intended for more complex and extensive applications and having many functions to perform, may use additional software for initialization and also for general operations. The power-on initialization method 600 proceeds to decision block 640.

At decision block 640 of the power-on process, the micro-controller 108, under program control, ascertains whether a full boot image is to be obtained. If a full boot image is used, the power-on initialization method 600 proceeds to block 650, otherwise, it proceeds to block 670.

At block 650 of the power-on process, the micro-controller 108 enables additional on-die or external storage devices (in addition to EP-NVM 103) to read from, for example the boot NVM 106. The enablement of the additional storage may entail the enablement of additional clock and power supplies that support the storage device. The power-on initialization method 600 proceeds to block 660.

At block 660 of the power-on process, the micro-controller 108 may use the interface controller 109 to connect with the additional storage devices and retrieve additional microcode including a full boot image. The additional software may be stored on IMEM 111 and DMEM 112. The power-on initialization method 600 proceeds to block 670.

At block 670 of the power-on process, the micro-controller 108 may use the additional software and data, such as the full boot image, to initialize all the functional blocks 105 of the ASIC device 101, as described herein. The power-on initialization method 600 proceeds to block 680.

At block 680 of the power-on process, the power-on initialization method 600 terminates.

Examples in the present disclosure may also be directed to a non-transitory computer-readable medium storing computer-executable instructions and executable by one or more processors of the computer via which the computer-readable medium is accessed. A computer-readable media may be any available media that may be accessed by a computer. By way of example, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Note also that the software implemented aspects of the subject matter claimed below are usually encoded on some form of program storage medium or implemented over some type of transmission medium. The program storage medium is a non-transitory medium and may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The claimed subject matter is not limited by these aspects of any given implementation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

This concludes the detailed description. The particular embodiments disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the appended claims. Accordingly, the protection sought herein is as set forth in the claims below.

What is claimed is:

1. An application-specific integrated circuit (ASIC) comprising:
   a die on which the ASIC is fabricated;
   an electrically programmable non-volatile memory (EP-NVM) integrated on the die, the EP-NVM being distinct from the ASIC and including an initialization program and a boot image; and
   an ASIC initialization engine including a boot microcode engine and a micro-controller, the boot microcode engine configured to initialize the micro-controller, and the micro-controller configured to:
      read the initialization program from the EP-NVM integrated on the die,
      write the initialization program to a micro-controller memory, and
      disable external write and read access to the micro-controller memory until authentication of the boot image from the EP-NVM is completed.

2. The ASIC of claim 1, further comprising an interface controller included in the ASIC initialization engine to drive different interfaces to transmit data and initialize a plurality of functional blocks.

3. The ASIC of claim 1, wherein a bootstrap image is included in a plurality of executable instructions in the EP-NVM, and wherein the bootstrap image is different than the boot image.

4. The ASIC of claim 3, wherein the micro-controller includes an instruction memory (IMEM) and a data memory (DMEM) to receive the bootstrap image to be executed by the micro-controller.

5. The ASIC of claim 4, wherein the bootstrap image includes information that allows the micro-controller to retrieve a second boot image from a storage device other than the EP-NVM.

6. The ASIC of claim 1, wherein a set of boot microcode for the boot microcode engine allows transfer of contents of the EP-NVM to internal memories of the micro-controller.

7. The ASIC of claim 1, wherein contents of the EP-NVM provide information for an initialization of the ASIC initialization engine first, and other ASIC functional blocks subsequently.

8. The ASIC of claim 1, wherein contents of the EP-NVM includes microcode and a bootstrap image.

9. The ASIC of claim 2, wherein the interface controller allows access to a plurality of functional blocks of the ASIC.

10. A method of initializing an application-specific integrated circuit (ASIC), the method comprising:
   obtaining a die on which the ASIC is fabricated;
   electrically writing microcode into an electrically programmable non-volatile memory (EP-NVM) integrated on the die, wherein the EP-NVM comprises an initialization program and a boot image;
   reading, by a boot microcode engine deployed within an ASIC initialization engine integrated with the ASIC, the microcode from the EP-NVM, wherein the microcode comprises the initialization program from the EP-NVM integrated on the die;
   writing the microcode onto, a micro-controller memory of a micro-controller integrated with the ASIC;
   disabling external write and read access to the micro-controller memory until authentication of the boot image from the EP-NVM is completed;
   initializing the micro-controller by the boot microcode engine; and
   initializing the ASIC by the micro-controller based on the microcode.

11. The method of claim 10, further comprising enabling a clock and a power supply by the boot microcode engine.

12. The method of claim 10, further comprising sending a signal from the ASIC via a general programmable input/output (GPIO) interface, the signal indicating success or failure of initialization of the ASIC.

13. The method of claim 10, wherein the micro-controller memory of the micro-controller include an instruction memory and a data memory to hold the microcode for execution by the micro-controller.

14. The method of claim 10, wherein the ASIC initialization engine to perform initialization of the ASIC using the initialization program from the EP-NVM integrated on the die.

15. The method of claim 14, wherein the ASIC initialization engine further includes an interface controller to allow data transfer to initialize functional blocks of the ASIC.

16. The method of claim 10, wherein the microcode includes a bootstrap image to enable the micro-controller to start executing software upon power-up and wherein the bootstrap image is different than the boot image.

17. A method of initializing an application-specific integrated circuit (ASIC), the method comprising:
   obtaining a die on which the ASIC is fabricated;
   electrically writing microcode into an electrically programmable non-volatile memory (EP-NVM) integrated on the die, wherein the EP-NVM comprises an initialization program and a boot image;
   reading, by a boot microcode engine integrated with the ASIC, the microcode from the EP-NVM, wherein the microcode comprises an initialization program from the EP-NVM integrated on the die;
   writing the microcode onto a micro-controller memory of a micro-controller of the ASIC;
   disabling external write and read access to the micro-controller memory until authentication of the boot image from the EP-NVM is completed;
   initializing the micro-controller by the boot microcode engine;
   loading, by the micro-controller, a full boot image from a storage device distinct from the EP-NVM onto the micro-controller memory of the micro-controller; and
   initializing the ASIC by the micro-controller based on the full boot image.

18. The method of claim 17, wherein the storage device comprises a boot non-volatile memory.

19. The method of claim 17, wherein the micro-controller enables a clock and a power source supporting an additional storage device prior to loading the full boot image.

20. The method of claim 17, wherein the micro-controller uses an interface controller included in an ASIC initialization engine to access an additional storage device to load the full boot image.

* * * * *